US008985268B2

(12) United States Patent
Wilson

(10) Patent No.: US 8,985,268 B2
(45) Date of Patent: Mar. 24, 2015

(54) SPEAKER ENCLOSURE FRAME

(71) Applicant: David A. Wilson, Provo, UT (US)

(72) Inventor: David A. Wilson, Provo, UT (US)

( * ) Notice: Subject to any disclaimer, the term of this patent is extended or adjusted under 35 U.S.C. 154(b) by 0 days.

(21) Appl. No.: 13/907,684

(22) Filed: May 31, 2013

(65) Prior Publication Data

US 2014/0353075 A1 Dec. 4, 2014

(51) Int. Cl.

| | |
|---|---|
| ***H05K 5/02*** | (2006.01) |
| ***H04R 1/02*** | (2006.01) |
| ***H04R 1/22*** | (2006.01) |
| *H05K 5/00* | (2006.01) |
| *H04R 1/00* | (2006.01) |

(52) U.S. Cl.

CPC .................................... *H04R 1/026* (2013.01)

USPC ........... 181/148; 181/151; 181/199; 381/345; 381/354

(58) Field of Classification Search

USPC .......... 181/148, 151, 149, 150, 199; 381/345, 381/353, 354

See application file for complete search history.

(56) References Cited

U.S. PATENT DOCUMENTS 2,993,091 A 7/1961 Guss
3,059,720 A * 10/1962 Matsuoka .................... 381/420
3,247,926 A * 4/1966 Metros .......................... 181/151
3,275,100 A * 9/1966 Dunning ....................... 381/348
3,430,728 A * 3/1969 Dunning ....................... 381/348
3,473,625 A * 10/1969 Heisrath ....................... 381/336
3,529,691 A 9/1970 Wesemann
3,578,103 A 5/1971 Lennes
3,757,890 A * 9/1973 Dunning ....................... 381/351
3,811,532 A * 5/1974 Everitt .......................... 181/156
4,057,689 A * 11/1977 Stallings, Jr. ................ 381/335
4,071,111 A * 1/1978 Croup ........................... 181/149
4,167,985 A * 9/1979 Dunlavy ....................... 181/148
4,433,749 A * 2/1984 Watkins et al. ............... 181/151
4,640,381 A * 2/1987 Tsuchiya et al. .............. 181/144
4,650,031 A * 3/1987 Yamamoto .................... 181/156
4,802,551 A 2/1989 Jacobsen
4,860,370 A 8/1989 Grosbard
4,869,340 A 9/1989 Coudoux
4,884,655 A * 12/1989 Freadman et al. ............ 181/145
4,924,964 A 5/1990 Olsen
5,046,104 A * 9/1991 Kloss ............................ 381/335
5,138,656 A * 8/1992 Shanes ..................... 379/167.11
5,194,701 A 3/1993 Yamada-Scriba
5,667,204 A 9/1997 Slocum
5,731,553 A 3/1998 Ledoux (Continued)

FOREIGN PATENT DOCUMENTS

FR 2565759 A1 * 12/1985 ............... H04R 1/02
JP 57152294 A * 9/1982 ............... H04R 1/02

(Continued)

OTHER PUBLICATIONS

International Search Report and Written Opinion of the International Searching Authority from related PCT App. No. PCT/US14/40001 dated Oct. 10, 2014.

*Primary Examiner* — Edgardo San Martin

(74) *Attorney, Agent, or Firm* — Bateman IP

(57) ABSTRACT

A speaker enclosure may include a speaker enclosure frame with a back wall, a first, inner wall and a second, outer wall extending from the back wall. The first, inner wall may be longer than the second, outer wall such that a baffle attaches to the first, inner wall, but only attaches to the second, outer wall via the first, inner wall and the back wall.

20 Claims, 4 Drawing Sheets

(56) References Cited

U.S. PATENT DOCUMENTS

| | | | | |
|---|---|---|---|---|
| 5,866,858 | A | 2/1999 | Dewey | |
| 6,550,570 | B2 * | 4/2003 | Combest | 181/150 |
| 6,561,311 | B2 | 5/2003 | Chuang | |
| 6,675,932 | B2 * | 1/2004 | Manrique et al. | 181/199 |
| 6,896,097 | B2 * | 5/2005 | Nishikawa et al. | 181/199 |
| 7,207,413 | B2 * | 4/2007 | Plummer | 181/199 |
| 7,325,649 | B1 | 2/2008 | Budge | |
| 8,356,689 | B2 * | 1/2013 | Huang | 181/199 |
| 2005/0196006 | A1 * | 9/2005 | Suzuki | 381/345 |
| 2008/0006477 | A1 * | 1/2008 | Huang | 181/199 |
| 2009/0211840 | A1 * | 8/2009 | Jiang | 181/199 |
| 2012/0318607 | A1 | 12/2012 | Reviel | |

FOREIGN PATENT DOCUMENTS

| | | | | |
|---|---|---|---|---|
| JP | 59219098 | A * | 12/1984 | H04R 1/28 |
| JP | 03129998 | A * | 6/1991 | H04R 1/28 |
| JP | 05049082 | A * | 2/1993 | H04R 1/02 |
| WO | WO2012/115158 | A1 | 8/2012 | |

* cited by examiner

SPEAKER ENCLOSURE FRAME

BACKGROUND OF THE INVENTION

1. The Field of the Invention

The present invention relates generally to speaker enclosures. More particularly, the present invention relates to speaker enclosures and methods for forming speakers which have improved sound quality.

2. State of the Art

Speakers are used in a variety of situations in order to communicate sound. They can be used as loudspeakers for public address, for movies or other events, or devices for playing music or for a host of other situations in which it is desirable to communicate sound. While there are a variety of quality levels at various sizes, it becomes increasingly difficult to produce wide dynamic range, high fidelity sound from small speakers. In fact, the smaller the speaker, the generally harder it is to get low frequencies played with high fidelity because low frequency extension benefits from large internal enclosure volume.

A speaker is typically formed with a speaker enclosure frame which forms the body of the speaker cabinet and a baffle into which the speaker driver(s) are disposed. In other words, as used herein, the enclosure frame generally relates to the back wall and sidewalls of the speaker cabinet, with the baffle forming the remaining of the cabinet.

Electrical signals sent to the speaker driver move the various parts of the speaker driver, which may include the cone, driver frame, magnetic system, front plate, rear plate, pole piece, etc., back and forth to create acoustical pressure waves. In most enclosed speakers, low frequency pressure waves generated by the speaker driver cone displacement press against walls of the speaker enclosure and tend to cause bowing or flexing. This is particularly problematic with walls which are relatively thin or which are made from materials that are less rigid. Additionally, low frequency and midrange sounds generated by the microscopic movement of the speaker driver's frame tend to be transmitted along the walls of the enclosure frame. Low frequency bowing or flexing of the enclosure walls along with their transmission of midrange sounds, creates pressure waves which interact with the pressure waves directly from the speaker driver and thereby distort the sound heard by a listener.

One known solution to vibration transfer through the enclosure frame is the use of rigid materials which, ideally, also have internal damping characteristics. For example, more than fifty years ago it was suggested to build the enclosure with bricks. Likewise damping materials, such as sand, have been used to dampen the propagation of the sound waves along and through the baffle and walls of the speaker enclosure frame. Unfortunately, such solutions are problematic, particularly when one is trying to build a small speaker. Due to size constraints, the use of bricks or other bulky materials leaves little room for the speaker itself and makes the speaker unusually heavy and volumetrically inefficient.

Another solution has been to use special materials and cross-bracing to keep flexing and transfer of sound waves to a minimum. While such materials and bracing provide a noticeable improvement in sound quality, they are also generally expensive and space consuming and result in a small speaker with disproportionate cost and reduced internal volume for bass loading.

Thus there is a need for an efficiently manufactured speaker enclosure which employs a method for reducing wall thickness while avoiding the need to use expensive, specialized materials, while also maximizing internal volume.

SUMMARY OF THE INVENTION

According to one aspect of the present disclosure, a speaker enclosure frame includes a first, inner wall which is substantially surrounded by a second, outer wall. A baffle may be substantially rigidly attached to the first, inner wall.

In accordance with one aspect of the disclosure, the baffle is not directly attached to the second, outer wall.

In accordance with another aspect of the disclosure, the baffle is not rigidly attached to the second outer wall.

According to another aspect of the present disclosure, the second, outer wall may be shorter than the first, inner wall, such that when a baffle is attached to the first, inner wall, it does not contact the second, outer wall, thereby minimizing the transfer of vibrational energy between the baffle and the second, outer wall.

According to another aspect of the present disclosure, a void is formed between the first, inner wall and the second, outer wall, and a damping medium, such as sand, granulated rubber, foam, steel wool, and/or other damping material(s) is disposed in the void such that the damping medium absorbs vibrational energy traveling along the first, inner wall and minimizes its transfer to the second, outer wall.

According to another aspect of the present disclosure, the first, inner wall and the second, outer wall are each attached at their respective rearward ends to a common back wall.

According to yet another aspect of the present disclosure, the first, inner wall is substantially rigidly attached to a baffle which holds one or more speaker drivers.

BRIEF DESCRIPTION OF THE DRAWINGS

Various embodiments of the present disclosure are shown and described in reference to the numbered drawings wherein.

Figure 1:
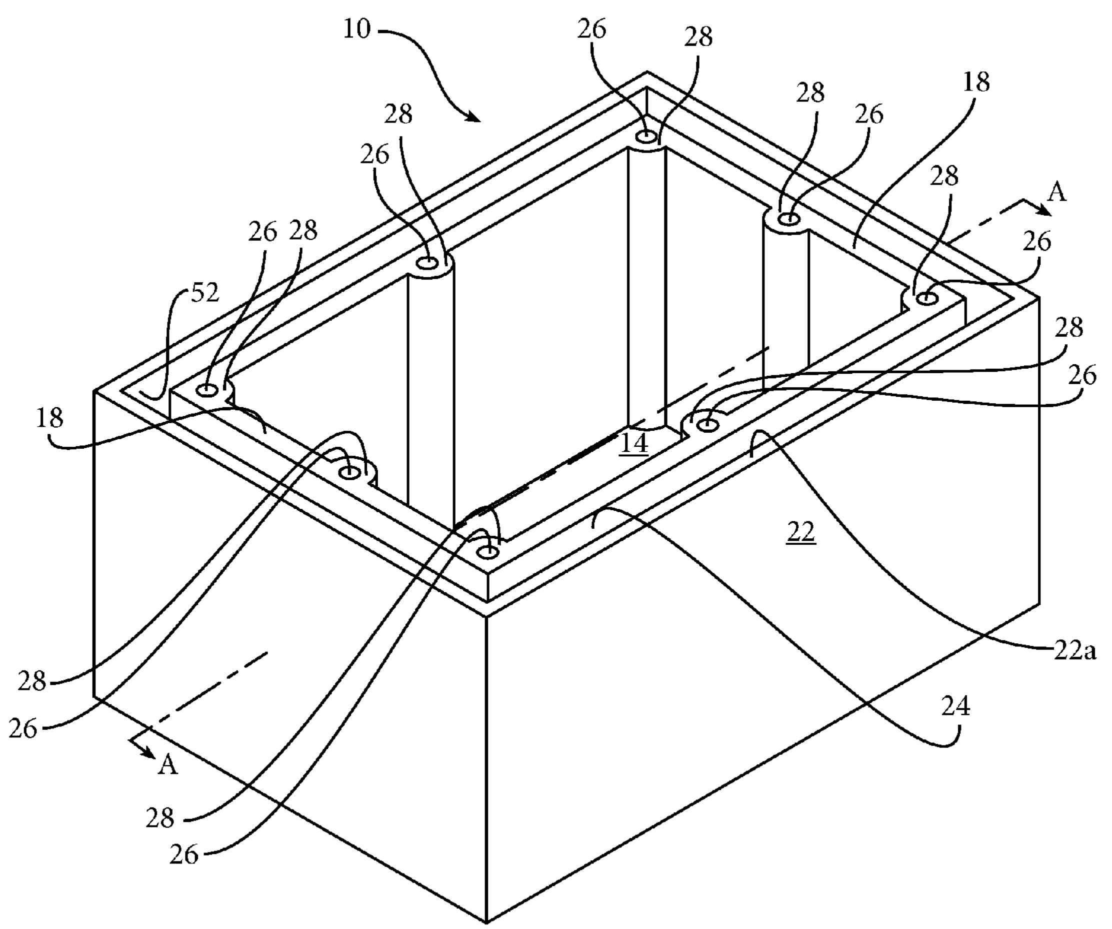
FIG. 1 shows a perspective view of a speaker enclosure frame made in accordance with the present disclosure.

It will be appreciated that the drawings are illustrative and not limiting of the scope of the invention which is defined by the appended claims. The embodiments shown accomplish various aspects of the invention. It is appreciated that it may not be possible to clearly show each element and aspect of the invention in a single figure, and as such, multiple figures are presented to separately illustrate the various details of the invention in greater clarity. Similarly, not every embodiment need accomplish all advantages of the present invention.

DETAILED DESCRIPTION

The invention will now be discussed in association with the accompanying drawings so as to enable one skilled in the art to make and use the invention(s) set forth in the present disclosure. The skilled artisan will understand, however, that the methods described below can be practiced without employing these specific details, or that they can be used for purposes other than those described herein. Indeed, they can be modified and can be used in conjunction with products and techniques known to those of skill in the art in light of the present disclosure. The drawings and descriptions are intended to be exemplary of various aspects of the invention and are not intended to narrow the scope of the appended claims which set forth the invention. Furthermore, it will be appreciated that the drawings may show aspects of the invention in isolation and the elements in one figure may be used in conjunction with elements shown in other figures.

Reference in the specification to "one embodiment," "one configuration," "an embodiment," or "a configuration" means that a particular feature, structure, or characteristic described in connection with the embodiment may be included in at least one embodiment, etc. The appearances of the phrase "in one embodiment" in various places may not necessarily limit the inclusion of a particular element of the invention to a single embodiment, rather the element may be included in other or all embodiments discussed herein unless shown or discussed to the contrary.

Furthermore, the described features, structures, or characteristics of embodiments of the present disclosure may be combined in any suitable manner in one or more embodiments. In the following description, numerous specific details are provided, such as examples of products or manufacturing techniques that may be used, to provide a thorough understanding of embodiments of the invention. One skilled in the relevant art will recognize, however, that embodiments discussed in the disclosure may be practiced without one or more of the specific details, or with other methods, components, materials, and so forth. In other instances, well-known structures, materials, or operations are not shown or described in detail to avoid obscuring aspects of the invention, but it will be appreciated that such well-known structures, materials or operations may be used in one or more of the embodiments discussed.

Before the present invention is disclosed and described in detail, it should be understood that the present invention is not limited to any particular structures, process steps, or materials discussed or disclosed herein, but is extended to include equivalents thereof as would be recognized by those of ordinary skill in the relevant art. More specifically, the invention is defined by the terms set forth in the claims. It should also be understood that terminology contained herein is used for the purpose of describing particular aspects of the invention only and is not intended to limit the invention to the aspects or embodiments shown unless expressly indicated as such. Likewise, the discussion of any particular aspect of the invention is not to be understood as a requirement that such aspect is required to be present apart from an express inclusion of the aspect in the claims.

It should also be noted that, as used in this specification and the appended claims, singular forms such as "a," "an," and "the" may include the plural unless the context clearly dictates otherwise. Thus, for example, reference to "a spring" may include one or more of such springs, and reference to "the layer" may include one or more of such layers.

As used herein, the term "substantially" refers to the complete or nearly complete extent or degree of an action, characteristic, property, state, structure, item, or result to function as indicated. For example, an object that is "substantially" enclosed would mean that the object is either completely enclosed or nearly completely enclosed. The exact allowable degree of deviation from absolute completeness may in some cases depend on the specific context, such that enclosing the nearly all of the length of a lumen would be substantially enclosed, even if the distal end of the structure enclosing the lumen had a slit or channel formed along a portion thereof. The use of "substantially" is equally applicable when used in a negative connotation to refer to the complete or near complete lack of an action, characteristic, property, state, structure, item, or result. For example, structure which is "substantially free of" a bottom would either completely lack a bottom or so nearly completely lack a bottom that the effect would be effectively or functionally similar to a situation where it completely lacked a bottom.

As used herein, the term "about" is used to provide flexibility to a numerical range endpoint by providing that a given value may be "a little above" or "a little below" the endpoint while still accomplishing the function associated with the range.

As used herein, a plurality of items, structural elements, compositional elements, and/or materials may be presented in a common list for convenience. However, these lists should be construed as though each member of the list is individually identified as a separate and unique member.

Concentrations, amounts, proportions and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation should apply regardless of the breadth of the range or the characteristics being described.

Distal and proximal, as used herein, are from the perspective of the person using the speaker enclosure. Thus, proximal means nearer to the user and distal means farther from the speaker enclosure.

Turning now to FIG. 1, there is shown a speaker enclosure frame, generally indicated at 10, of a speaker enclosure. The speaker enclosure frame 10 may include a back wall 14, a first, inner wall 18, and a second, outer wall 22. (While discussed herein as being back wall, etc., it will be appreciated that the speaker can be disposed in any orientation. Thus, the back wall 14 is that wall which is generally opposite the direction in which the speaker faces and would typically be the distal portion of the speaker during use—but the speaker could be placed, for example, with the back wall on the bottom or on the top depending on where the speaker rests or is mounted.)

The second, outer wall 22 extends about the periphery of the speaker enclosure frame and is spaced apart from the first, inner wall 18 which may extend generally parallel thereto so as to form a void 24 adjacent the periphery. As will be discussed in additional detail below, the spacing or void 24 between the first, inner wall 18 and the second, outer wall 22 can receive a damping medium which may be selected from one or more of the group including, but not limited to, sand, granulated rubber, steel wool, foam, or other material(s) which dampen or otherwise interferes with the transfer of vibrational energy.

The first, inner wall 18 may be taller or extend further from the back wall 14 than the second, outer wall 22. As will be explained in additional detail below, the first, inner wall 18 can be attached to a baffle which receives one or more speaker drivers. In accordance with one aspect of the present disclosure, the second, outer wall is shorter so that a front end **22*a*** does not contact the baffle, except indirectly through the back wall 14 and the inner wall 18. The lack of connection at the front end 22*a* of the outer wall 22 helps to reduce bowing in the outer wall which could be caused by low frequency sound vibrations as may be produced by a woofer, and helps to minimize the transfer of acoustic energy along the outer wall as is commonly created by a midrange speaker driver.

The first, inner wall 18 may have a plurality of voids 26 formed therein. The voids 26 may be formed in a wall of continuous thickness, or may be formed in protrusions 28 from the main portion of the wall as shown in FIG. 1. The protrusions 28 may extend the entire height of the wall or may extend a portion of the height.

The voids 26 formed in the first, inner wall 18 may be configured to receive fasteners, such as screws, rivets, etc., to hold a baffle to the first, inner wall 18. Thus, for example, the voids 26 may be formed by an inner wall which is threaded or otherwise shaped to hold a fastener. While fasteners used to engage the inner sidewall forming a void 26 could be flexible or otherwise allow for movement between the baffle and the first, inner wall 18, it is believed that a substantially rigid attachment between the first, inner wall and the baffle is preferable as it keeps the baffle from moving excessively, thereby keeping the speaker driver at a substantially stable position in space. Thus, generally inflexible screws are believed to be preferable, but not required.

One advantage of the configuration shown in FIG. 1 is that the speaker enclosure frame 10 provides a small, relatively inexpensive speaker enclosure which minimizes the distortion common with other small speaker enclosures. As will be explained in additional detail, the speaker enclosure frame 10 can be molded or cast relatively inexpensively, thereby avoiding the costs associated with extended machining time and/or specialized materials which are commonly used in "high-end" small speakers. Furthermore, the double-wall enclosure is effective at reducing unwanted vibrations and bowing in the outer wall 22 without taking a large amount of space out of the speaker enclosure frame's internal volume—thereby reducing any negative impact resulting from speaker size. A variety of materials may be used for the speaker enclosure frame 10, including, but not limited to, metal, plastics, synthetic composites or combinations thereof.

Figure 2:
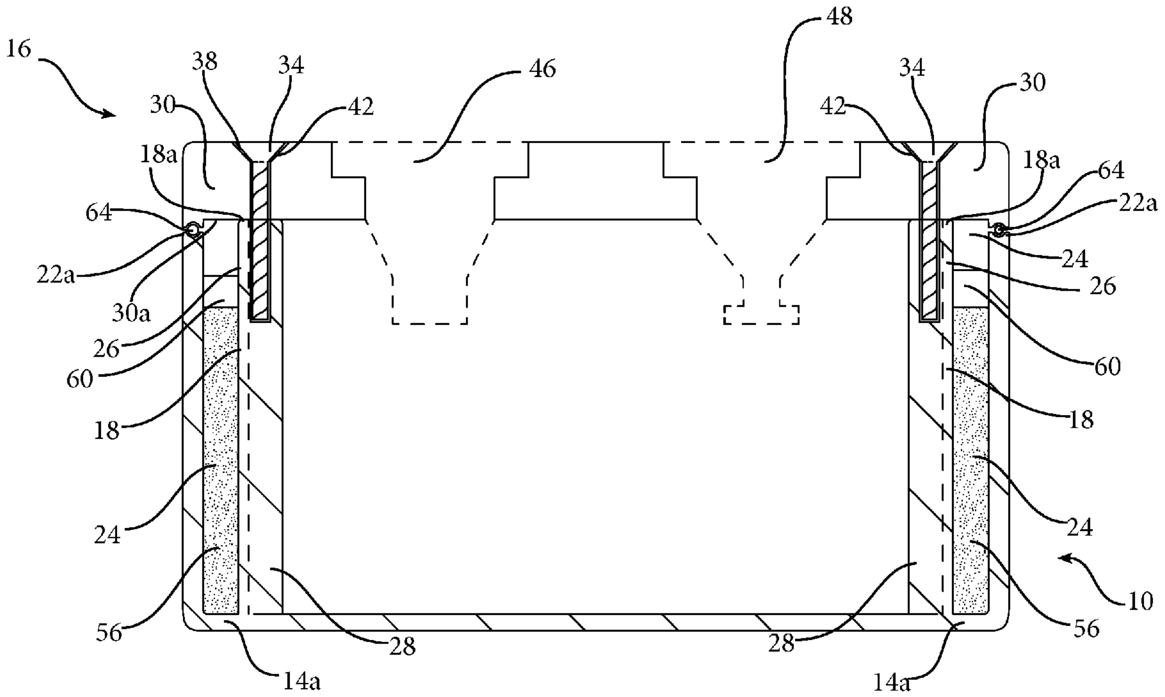
FIG. 2 shows a cross-sectional view of the speaker enclosure frame of FIG. 1.

Turning now to FIG. 2, there is shown a cross-sectional view of the speaker enclosure frame 10, taken along the plane A-A shown in FIG. 1, and a baffle 30, to thereby form a speaker enclosure, generally indicated at 16. (It will be appreciated that the dimensions between the two drawings is somewhat different, demonstrating that no particular size relationships are required unless expressly stated.) The baffle 30 may be attached to the speaker enclosure frame 10 by a variety of fasteners, including screws 34 which extend through holes 38 defined by interior sidewalls 42 in the baffle and into engagement with the voids 26 in the first, inner wall 18. The use of generally inflexible fasteners, such as metallic screws, etc., will cause the baffle 30 and the first, inner wall 18 to be held in substantially rigid attachment with one another. This, in turn, will minimize the movement of the baffle 30, giving the speakers (shown in dashed lines 46 and 48) a more stable position in space—thereby leading to a crisper sound.

While the baffle 30 is attached to the front end 18*a* of the first, inner wall 18, it may not be directly attached to the front end 22*a* of the second, outer wall 22. Thus, as the speakers 46, 48 are driven, the vibrational energy of the baffle 30 is passed directly to the first, inner wall. Due to the lack of direct connection, however, the vibrations are not passed directly to the second, outer wall 22. Rather, any vibrational energy conducted through a solid medium to the second, outer wall 22 must travel down the first, inner wall 18, through part of the back wall 14, and then up along the second, outer wall 22 toward the front end 22*a*.

To minimize the passage of the vibrational energy, a void or space 24 may be left between the first, inner wall 18 and the second, outer wall 22. The void or space 24 may be filled with a damping medium 56, which may be any of a variety of materials, such as sand, granulated rubber, foam, steel wool, other materials having damping properties, or combinations thereof. As vibrational energy travels along the first, inner wall 18, some of the energy is absorbed by the damping material or medium 56. Additionally, as the vibrational energy passes through the laterally exterior portion 14*a* of the back wall 14, additional vibrational energy may be lost. Finally, as the vibrational energy attempts to continue movement along the second, outer wall 22, still additional vibrational energy is lost due to the damping medium 56. The loss of vibrational energy in the second, outer wall 22 results in the wall bowing less in response to low frequency sound waves and transmitting less vibrational energy in response to midrange sounds. This, in turn, reduces the interference with the sound coming from the speakers 46, 48 which can ordinarily be caused by vibrations of the outer wall of the speaker enclosure.

Those skilled in the art will appreciate that the back wall 14 need not be double layered in accordance with the teachings of the present invention. While the back wall 14 will vibrate in response to the vibrational energy produced by the speakers 46, 48, the energy of those sound waves is generally directed away from the person listening to the speakers. Thus, the vibrational energy coming off the back wall 14 has much less impact on the quality of sound heard by the listener than does the outer wall of the speaker enclosure frame 10.

One advantage of such a configuration is that the first, inner wall 18 and the second, outer wall 22 can both be relatively thin. For example, in a speaker enclosure 5.5 inches by 7 inches by 5 inches, the inner wall 18 may be, for example between $\frac{1}{8}^{th}$ inch and $\frac{3}{16}^{th}$ inch thick, while the outer wall may be between $\frac{1}{8}^{th}$ of an inch and $\frac{1}{4}^{th}$ of an inch thick. The spacing between the walls may be, for example, $\frac{1}{4}^{th}$ of an inch. While a wide range of sizes may be used, the relative thinness of the inner wall 18 and the outer wall 22 allows the speaker enclosure frame 10 to be relatively light weight and to leave more room for the speaker drivers 46, 48. While the inner wall 18 appears relatively thick in FIG. 2, that is because the cross-sectional view is taken along plane A-A, which cross-sects the protrusions 28 as well. It will be appreciated that the protrusions 28 need not extend the entire height of the inner wall 18.

As was mentioned previously, the void or space 24 between the first, inner wall 18 and the second, outer wall 22 may be filled with a damping material 56, such as sand, granulated rubber, foam, steel wool or other materials known for damping vibrational energy. To hold the damping material in place, a retention member, such as a soft, flexible gasket 60, may be used. The gasket 60 may nest between the first, inner wall and the second, outer wall so as to keep the damping material from moving forward of some desirable point. The gasket 60 may be formed of rubber or a variety of other materials. It is currently preferred for the gasket to be formed from a material which minimizes the transfer of vibrational energy so as to minimize the transfer of vibrational energy in the front end 18*a* of the first, inner wall 18 to the front end 22*a* of the second, outer wall.

In addition to, or in place of, the gasket 60, a retention member, such as an "O-ring" 64 or other non-rigid gasket or similar structure, could be placed between the back side of the baffle 30 (or a rearwardly extending projection 30*a* as shown in FIG. 2) and the front end 22*a* of the second, outer wall. The O-ring 64 may be a highly compliant material to minimize the vibrational energy which could be transferred between the baffle 30 and the front end 22*a* of the second, outer wall 22. While it is presently preferred that the upper end 22*a* of the second, outer wall 22 is not attached in any way directly to the baffle 30, it would still be an improvement if the baffle and the upper end 22*a* of the outer wall 22 were not rigidly attached. Therefore, the O-ring could be attached to each structure with adhesive, etc.

In such a configuration, a small speaker enclosure can be formed which provides minimal interference with the sound waves emitted by the speakers 46, 48. Without the use of expensive materials and cross-bracing, a small enclosure provides less resonance and thus improves sound quality heard by the listener.

Figure 3:
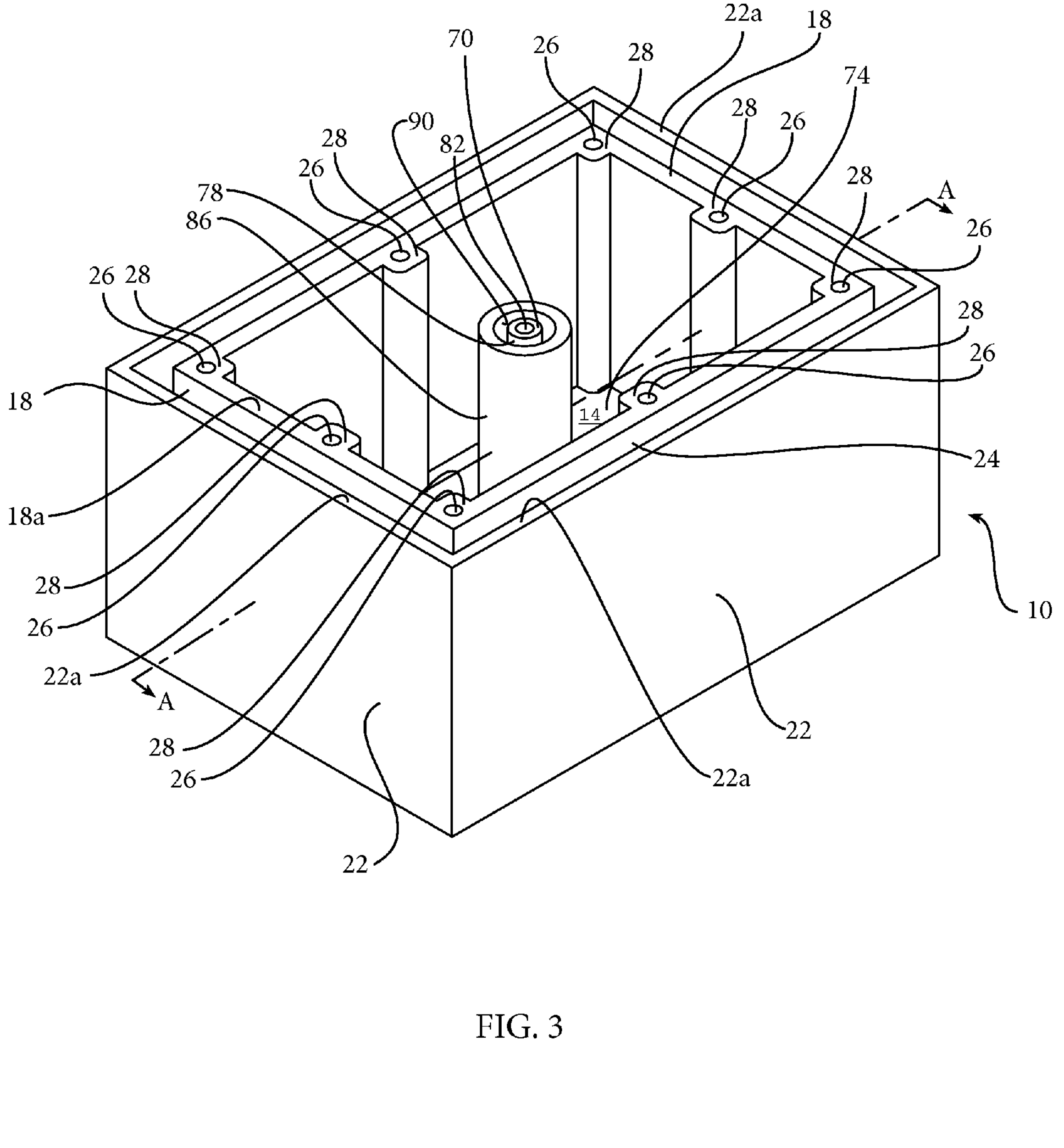
FIG. 3 shows a perspective view of an alternate embodiment of a speaker enclosure frame in accordance with the present disclosure.

Turning now to FIG. 3, there is shown a perspective view of a speaker enclosure frame 10 made in accordance with the teachings of the present disclosure. The speaker enclosure frame 10 includes a back wall 14, a first, inner wall 18 and a second, outer wall 22. As with the embodiment shown in FIGS. 1 and 2, the first, inner wall 18 may extend further from the back wall 14 than the second, outer wall 22. The first inner wall also includes a plurality of holes or voids 26 (either in the wall proper, in protrusions 28 extending from the wall, or in a position extending into both). The first, inner wall 18 and the second, outer wall 22 may also be spaced apart to leave a space or void 24 in a similar manner as that discussed with respect to FIGS. 1 and 2. Other portions of the speaker enclosure frame 10 which are similar to that discussed in FIG. 1 are numbered accordingly.

The speaker enclosure frame 10 in FIG. 3 is different than that shown in FIGS. 1 and 2 in that it adds a support post 70 in the hollow 74 of the speaker enclosure frame 10. The support post 70 effectively forms a post inner wall 78 which may include a hole or void 82 for receiving a fastener, such as a screw, etc. The post inner wall 78 is surrounded by a post outer wall 86 which may be spaced apart from the inner wall so as to leave a space or void 90. The support post 70 allows a central portion of a baffle 30 to be attached to the support post to thereby reduce the amount of travel in the central portion of the baffle as the baffle is vibrated by driving the speakers 46, 48.

Figure 4:
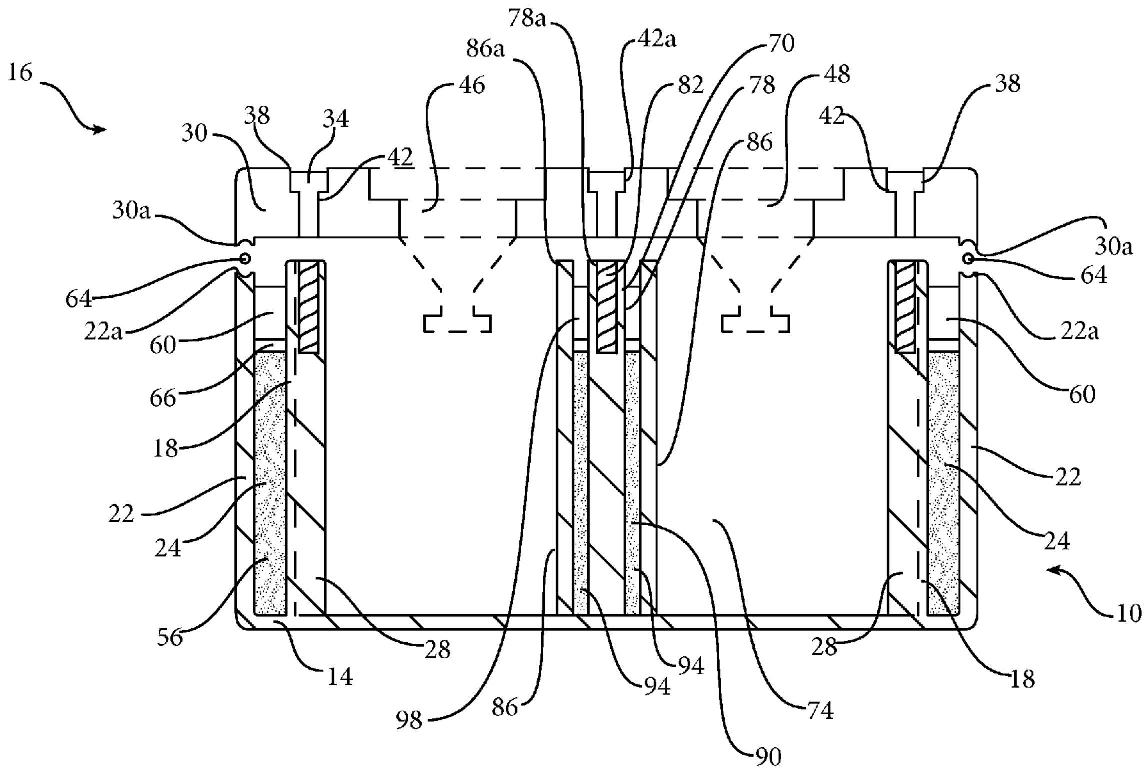
FIG. 4 shows a cross-sectional view of the speaker enclosure frame of FIG. 3.

Turning now to FIG. 4, there is shown a cross-sectional view of a speaker enclosure 16 including the speaker enclosure frame 10 and a baffle 30. The baffle 30 has a plurality of holes formed therein by interior walls 42 which can receive screws 34 or other fasteners. Included in these is a central hole defined by an interior wall 42*a* for use in securing a central portion of the baffle 30 to the support post 70 via a fastener, such as a screw, etc. Similar to the inner wall 18 and the outer wall 22 about the sides of the speaker enclosure frame 10, the support post 70 may include a post inner wall 78 into which a threaded hole 82 is formed, and a post outer wall 86 which extends generally coaxially with the inner wall. The post inner wall 78 and the post outer wall 86 may be spaced apart to leave a space or void 90 which may be filled with a damping material 94 such as sand, granulated rubber, foam or a number of other damping materials. A circular gasket 98 may be disposed about near the upper portion 78*a* of the post inner wall 78 and upper portion 86*a* of the post outer wall 86 to holding the damping material 94 in the space 90.

Because the post 70 directly engages baffle 30, the vibrations from the baffle tend to travel along the post. By use of the damping material 94 and the post outer wall 86 which does not engage the baffle directly, the propagation of the acoustical energy into the space surrounding the speaker drivers 46 and 48 is reduced. Additionally, the damping material 94 applies some attenuation to vibrations propagating down post 70, thus reducing the energy received by back wall 14.

The remaining portions of FIG. 4 are similar to those shown in FIG. 2 and are thus not discussed in detail. One difference that can be used in either configuration is to leave an air pocket 66 between the damping material (such as 56 between the inner wall 18 and outer wall 22) and the gasket 60.

While shown herein as a generally rectangular enclosure, it will be appreciated that the enclosure frame need not be rectangular. Likewise, the inner wall and the outer wall need not be parallel to one another, although this is a presently preferred embodiment.

It will be appreciated from the present disclosure, that the invention can be practiced in multiple configurations and embodiments. For example, a speaker enclosure may include a back wall, an inner wall extending from the back wall with the inner wall having a front end disposed opposite the back wall and an outer wall extending from the back wall, the outer wall having a front end disposed opposite the back wall, the inner wall and the outer wall being spaced apart to leave a space between the inner wall and the outer wall; and a baffle attached to the front end of the inner wall. Additionally, the speaker enclosure frame may include one or more of the following: the outer wall being unattached to the baffle independent of the inner wall; the outer wall being shorter than the inner wall such that the front end of the inner wall extends beyond the outer wall; the outer wall being disposed about the periphery of the speaker enclosure so as to form on outer wall thereof, and wherein the inner wall is contained inside of the outer wall; the inner wall having a plurality of protrusions extending therefrom and a plurality of holes formed at least partially in the protrusions for receiving fasteners therein; a damping material disposed between the inner wall and the outer wall; a gasket disposed between the inner wall and the outer wall for holding the damping material between the inner wall and the outer wall; an O-ring disposed between the baffle and the outer wall; the baffle being attached to the inner wall, the outer wall not touching the baffle; a support post being disposed inside the inner wall, the support post extending from the back wall; a post outer wall surrounding and spaced apart from the post, the outer post wall being shorter than the post; and/or a damping material being disposed between the post and the post outer wall, or combinations thereof.

Likewise, the invention may include a speaker enclosure frame having a back wall, a first, inner wall extending from the back wall, and an outer wall extending from the back wall substantially parallel to the inner wall so as to leave a space between the inner wall and the outer wall, the outer wall being shorter than the inner wall. The speaker enclosure frame may also include: the inner wall having a plurality of protrusions and holes formed at least partially in the protrusions, the holes being defined by inner walls having an engagement surface for receiving fasteners; the speaker enclosure frame being generally rectangular and wherein the space between the inner wall and the outer wall is generally rectangular; a post extending from the back wall in generally the same direction as the inner wall and the outer wall, the post being in an area circumscribed by the inner wall; a post outer wall disposed about and spaced from the post so as to leave a space therebetween, the post outer wall being shorter than the post; and/or damping material disposed in the space between the post and the outer post wall and a retention member disposed between the post and the post outer wall for holding the damping material in place, or combinations thereof.

The invention may also include a method for forming a speaker. For example the method may include selecting a speaker enclosure frame having a back wall, an inner wall extending from the back wall and an outer wall extending from the back wall, a space being disposed between the inner wall and the outer wall, and attaching a baffle to the inner wall and not directly to the outer wall such that the baffle does not directly touch the outer wall. The method may also include disposing a damping material in the space between the inner wall and the outer wall and disposing a retention member adjacent the space between the inner wall and the outer hall to hold the damping material in the space.

The method may further include using a support post attaching to a baffle and being surrounded by a post outer wall. The post outer wall may be shorter than the post so that the baffle does not directly contact the post outer wall. A damping material may be disposed between the post outer wall and the post.

There is thus disclosed an improved speaker enclosure frame for improving fidelity for speakers and the like. Those of skill in the art will appreciate that many modifications can be made within the scope of the present invention. The appended claims are intended to cover such modifications.

What is claimed is:

1. A speaker enclosure comprising:

a back wall;

an inner wall extending from the back wall, the inner wall having a front end disposed opposite the back wall; and an outer wall extending from the back wall, outer wall having a front end disposed opposite the back wall, the inner wall and the outer wall being spaced apart to leave a space between the inner wall and the outer wall; and a baffle attached to the front end of the inner wall.

2. The speaker enclosure of claim 1, wherein the outer wall is unattached to the baffle independent of the inner wall.

3. The speaker enclosure of claim 1, wherein the outer wall is not rigidly attached to the baffle independent of the inner wall.

4. The speaker enclosure of claim 1, wherein the outer wall is shorter than the inner wall such that the front end of the inner wall extends beyond the outer wall.

5. The speaker enclosure of claim 1, wherein the outer wall is disposed about the periphery of the speaker enclosure so as to form on outer wall thereof and wherein the inner wall is contained inside of the outer wall.

6. The speaker enclosure of claim 1, wherein the inner wall has a plurality of protrusions extending therefrom and a plurality of holes formed at least partially in the protrusions for receiving fasteners therein.

7. The speaker enclosure of claim 1, further comprising a damping material disposed between the inner wall and the outer wall.

8. The speaker enclosure of claim 6, further comprising a gasket disposed between the inner wall and the outer wall for holding the damping material between the inner wall and the outer wall.

9. The speaker enclosure of claim 1, further comprising a non-rigid gasket disposed between the baffle and the outer wall.

10. The speaker enclosure of claim 1, wherein, when the baffle is attached to the inner wall, the outer wall does not touch the baffle.

11. The speaker enclosure of claim 1, further comprising a support post disposed inside the inner wall, the support post extending from the back wall.

12. The speaker enclosure of claim 11, further comprising a support post outer wall surrounding and spaced apart from the support post, the support post outer wall being shorter than the support post.

13. The speaker enclosure of claim 12, further comprising damping material disposed between the support post and the support post outer wall.

14. A speaker enclosure frame comprising:

a back wall;

a first, inner wall extending from the back wall; and an outer wall extending from the back wall substantially parallel to the inner wall so as to leave a space between the inner wall and the outer wall, the outer wall being shorter than the inner wall.

15. The speaker enclosure frame of claim 14, wherein the inner wall has a plurality of protrusions and holes formed at least partially in the protrusions, the holes being defined by inner walls having an engagement surface for receiving fasteners.

16. The speaker enclosure frame according to claim 14, further including a post extending from the back wall in generally the same direction as the inner wall and the outer wall, the post being in an area circumscribed by the inner wall.

17. The speaker enclosure frame of claim 16, further comprising a post outer wall disposed about and spaced from the post so as to leave a space therebetween, the post outer wall being shorter than the post.

18. The speaker enclosure frame of claim 17, further comprising damping material disposed in the space between the post and the post outer wall and a retention member disposed between the post and the post outer wall for holding the damping material in place.

19. A method for forming a speaker, the method comprising:

selecting a speaker enclosure frame having a back wall, an inner wall extending from the back wall and an outer wall extending from the back wall, a space being disposed between the inner wall and the outer wall; and attaching a baffle to the inner wall and not directly to the outer wall such that the baffle does not directly touch the outer wall.

20. The method according to claim 19, wherein the method further comprises disposing a damping material in the space between the inner wall and the outer wall and disposing a retention member adjacent the space between the inner wall and the outer hall to hold the damping material in the space.

* * * * *

UNITED STATES PATENT AND TRADEMARK OFFICE

CERTIFICATE OF CORRECTION

PATENT NO. : 8,985,268 B2
APPLICATION NO. : 13/907684
DATED : March 24, 2015
INVENTOR(S) : David A. Wilson It is certified that error appears in the above-identified patent and that said Letters Patent is hereby corrected as shown below:

In the claims,

Column 9, line 30: Insert --the-- before second “outer wall.” Line 30 should read: “an outer wall extending from the back wall, the outer wall”
Column 9, line 44: Change “the periphery” to “a periphery.” Line 43 should read: “is disposed about a periphery of the speaker enclosure so as”
Column 9, line 45: Change “on” to “an.” Line 44 should read: “to form an outer wall thereof and wherein the inner wall is”

Signed and Sealed this
Fifteenth Day of March, 2016

*Michelle K. Lee*

Michelle K. Lee
*Director of the United States Patent and Trademark Office*